United States Patent [19]

Canu

[11] 4,271,390
[45] Jun. 2, 1981

[54] ELECTRIC WATT-HOUR METER TESTING DEVICE

[76] Inventor: John C. Canu, 4045 Delmar Dr., Laurel, N.Y. 11948

[21] Appl. No.: 116,533

[22] Filed: Jan. 29, 1980

Related U.S. Application Data

[63] Continuation of Ser. No. 948,693, Oct. 5, 1978, abandoned, which is a continuation-in-part of Ser. No. 841,660, Oct. 13, 1977, abandoned.

[51] Int. Cl.³ .............................................. G01R 11/32
[52] U.S. Cl. ................................................... 324/74
[58] Field of Search ............................ 324/74, 130, 76

[56] References Cited
U.S. PATENT DOCUMENTS 1,942,258  1/1934  Rutter et al. ............................ 324/74

OTHER PUBLICATIONS

Musson et al.; "Recent Developments . . . "; Proc. of the IEE; vol. 97; Part II; No. 56; Apr. 1950; pp. 97–107.

Primary Examiner—Ernest F. Karlsen
Attorney, Agent, or Firm—Bauer & Amer

[57] ABSTRACT

A self-contained meter tester that provides the ability to test the efficiency of an electric watt-hour meter at the operational site by isolating the meter from the normally connected time-varying load, passing a known voltage through the meter to a calibrated constant load and measuring the known load with the meter to check its operational accuracy. In another aspect of the invention, the meter tester includes the ability to independently measure the constant load and for adjusting the same to a selected value.

5 Claims, 7 Drawing Figures

ELECTRIC WATT-HOUR METER TESTING DEVICE

FIELD OF THE INVENTION

This application is a continuation of co-pending application Ser. No. 948,693, filed Oct. 5, 1978, now abandoned, that was a continuation-in-part of co-pending application Ser. No. 841,660, filed Oct. 13, 1977, now abandoned.

This invention relates to electrical testing devices, and more particularly to a device for testing the operational accuracy of an electric watt-hour meter.

BACKGROUND OF THE INVENTION

The rising cost of electricity has made users of electric power increasingly sensitive to inefficiencies and waste in its use. As homeowners seek to reduce their utility bills by tracking down and removing sources of waste, electric companies have been receiving many inquiries from consumers questioning the accuracy of electrical watt-hour meters that are employed to record the consumption of electricity at the operational site. The users of electricity, understandably, do not want to be overcharged, and the utilities are even more anxious not to have their good will damaged by allegations of overcharging. It is, therefore, desirable that a complaint about improper meter operation be promptly investigated and that any inaccuracies discovered be promptly remedied.

Typically, electric power meter testing and calibration is performed at specially designed and equipped laboratories staffed by electric company employees trained to operate highly sophisticated and complex equipment. A consumer's request for a determination of the accuracy of his watt-hour meter usually requires that the meter be removed from the premises (and be temporarily replaced with another) so it may be brought to the testing laboratory. Once there, the suspect meter and a standard meter are simultaneously subjected to the same energizing and loading circuitry and a comparison of the results is made. If the meter being tested proves to be operationally accurate, a great deal of time and effort has been expended that could have been more efficiently utilized elsewhere. Hence, it is more desirable to be able to quickly, easily and accurately test the meter at its site of use.

The prior art discloses several devices for spot-testing the meter at the operational site or premises as typified by U.S. Pat. Nos. 2,218,650 to W. J. Larson and 2,249,075 to D. A. Young et al. These devices generally comprise a base member for interposition between an electric meter and its supporting pan and include outlet conductors, in the form of cables or test points, for connection to suitable external measuring instruments. The use of external instruments therewith necessitates that expensive equipment be brought into the field and connected for use at the test site. This presents an increased chance of damage to such equipment as a result of adverse environmental conditions or incorrectly performed connections between the equipment and the testing device. In addition, special technical training of those who are to perform the in-field testing is required to acquaint such persons with the operation of the external measuring instruments and with the particular tests to be performed in order to quickly determine whether the tested watt-hour meter is accurately performing its task.

OBJECTS OF THE INVENTION

It is, therefore, the desideratum of the present invention to provide a self-contained test device, complete in itself, that may be simply connected to a watt-hour meter at the operational premises to quickly and easily permit an evaluation of the accuracy of the meter without changing or varying the surrounding and prevailing conditions.

It is a further object of the present invention to provide a device to test a watt-hour meter in accordance with the above by connecting the same to a known, constant load and isolating the meter from all other electrical loads normally associated with the operational premises.

It is an additional object of the present invention to provide a test device that is inexpensive to manufacture and, yet, durable in construction so as to avoid accidental damage thereto as a result of mishandling of the device or due to frequent use under a variety of adverse environmental conditions.

It is yet another object of the present invention to provide an electric meter testing device that is relatively simple to use so as to enable its use by one without extensive technical training or special skills.

Further objects, features and advantages of the present invention will be more fully appreciated by reference to the following detailed description of presently preferred, but nonetheless illustrative, embodiments in accordance with the present invention, when taken in conjunction with the accompanying drawings.

BRIEF DESCRIPTION OF THE DRAWINGS

In the drawings, wherein similar reference characters denote similar elements throughout the several views.

DETAILED DESCRIPTION OF THE PREFERRED EMBODIMENTS

The present invention comprises an electric watt-hour meter testing device which is adapted to quickly and easily determine the accuracy of a watt-hour meter that is suspected to be improperly functioning, the testing being performed at the meter's normal operational site. In this way, it becomes unnecessary to remove the watt-hour meter from the premises to a meter-testing laboratory unless the present invention first indicates that it is inaccurately measuring the flow of electric power passing therethrough. Since the meter testing device may be fabricated at low cost from standard components, considerable cost savings to a utility are possible by avoiding unnecessary removals of the watt-hour meters for testing that are later determined to be operationally accurate within the limits set by the utilities and the Public Service Commission.

Figure 1:
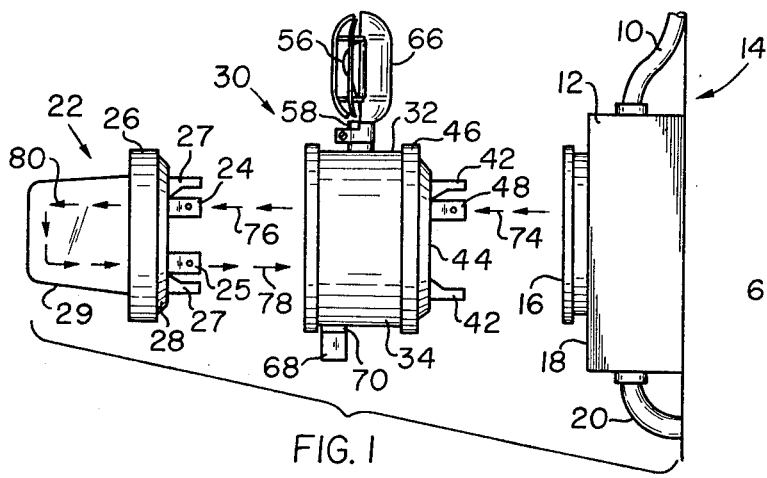
FIG. 1 shows an expanded side view of an electric watt-hour meter testing device constructed according to the teaching of the present invention operationally interposed for use between a watt-hour meter and its supporting meter pan.

As shown in FIG. 1, electricity is provided by the utility or power company through a supply cable 10. The supply cable 10 feeds the electricity to a meter pan or socket 12 typically mounted on an exterior surface or equivalent portion of the premises or site 14 where the demand for electricity exists. The meter pan 12 of conventional construction is generally provided with an annular flange 16 projecting outwardly of the face surface 18 thereof. Although not shown in the drawing, a selectively configured cavity is defined within the bounds of the flange 16 and two pair of electricity conducting sockets are recessed therein. The first pair of said sockets is connected to the supply cable 10 while the second pair thereof is connected to a distribution cable or load line 20 which provides electricity to the existing electrical loads of the premises 14.

The meter pan 12 is adapted to removably receive thereon a conventional electric watt-hour meter generally identified by the reference numeral 22. The watt-hour meter 22 is definitionally a watt meter that will register the watt hours of electricity consumed at the premises 14 during a period of time. To this end, all electric power entering the premises 14 through the load line 20 must first pass through the watt-hour meter 22 for measurement and registration thereby. The meter 22 is, therefore, provided with two pairs of blade-like conducting arms. Specifically, a pair of laterally spaced electrically conductive input arms 24 receives electricity from the supply cable 10 through engagement of the arms 24 with the meter pan first socket pair, and a pair of laterally spaced electrically conductive output arms 25 returns the electricity after its measured passage through the meter 22 to the second socket pair on the meter pan 12 for distribution to the premises load by way of the load line 20. The arms 24, 25 are configured and relatively spaced to mate with the socket pairs on the meter pan 12 and may, for this purpose, comprise planar rectangular blade-shaped members projecting from a rear surface of the watt-hour meter 22, as shown in FIG. 1.

The pairs of conducting arms 24, 25 are engaged with the corresponding meter pan socket pairs by seating the watt-hour meter within the appropriately configured cavity in the meter pan 12. To facilitate the proper seating of the meter 22 relative to the pan 12, the meter 22 is provided with an annular shoulder 26, which cooperates with the meter pan flange 16 when the two are operationally positioned. Positioning fins 27 on the meter 22 further contributes to the proper relative engagement of the meter 22 and the meter pan 12 to insure the completion of electrical interconnections therebetween. The watt-hour meter 22 additionally comprises, on opposite sides of the shoulder 26, an electrically non-conductive or dielectric base portion 28 with which the positioning fins 27 may be integrally formed and a frusto-conical glass cover or dome 29.

Electrically, the watt-hour meter 22 usually consists essentially of a motor having a rotating element, and a registering mechanism (not shown because the same is conventional and forms no part of this invention). A typical electric watt-hour meter consistent with this description and with which the present invention may be utilized is a type 1-70-S General Electric Model AR1. The rotating element generally comprises a metallic disk of substantially circular configuration, the rotational speed of which is proportional to the magnitude of the electric power to be measured. The registering mechanism usually is connected to the motor and rotating element by suitable gearing means to register, as with indicating dials or the like, the total amount of electric power that has passed through the meter 22 during a period of time. Thus, since the watt-hour meter's motor runs at a speed proportional to the electrical energy passing therethrough, it drives the registering or counting mechanism at the proper speed to indicate the amount of energy consumed by the premises load. Each such conventional electrical watt-hour meter has associated with it and printed thereon a numerical "Kh constant," typically a number between "2" and "12," which relates the movement of the meter disk and indicating dials to the amount of electric power passing through the watt-hour meter.

The indicating dials of the registering mechanism and at least a portion of the rotating disk are positioned so as to be clearly visible through the glass dome 29 of the meter 22. A utility company employee is, therefore, easily able to "read the meter"—i.e. read the registering mechanism indicating dials—without removing the meter from its pan-engaged operational position and to observe the motion of the rotating disk to insure that electric power is passing through the meter 22 for recording thereby.

It should be noted that although various makes of watt-hour meters differ somewhat as to arrangement and construction of the working parts, the principles involved and the general operation thereof are practically the same in all. The description herein should, therefore, be appreciated to be applicable to electric watt-hour meters in general, without regard to the particular make, model or arrangement of details of the same.

Figure 3:
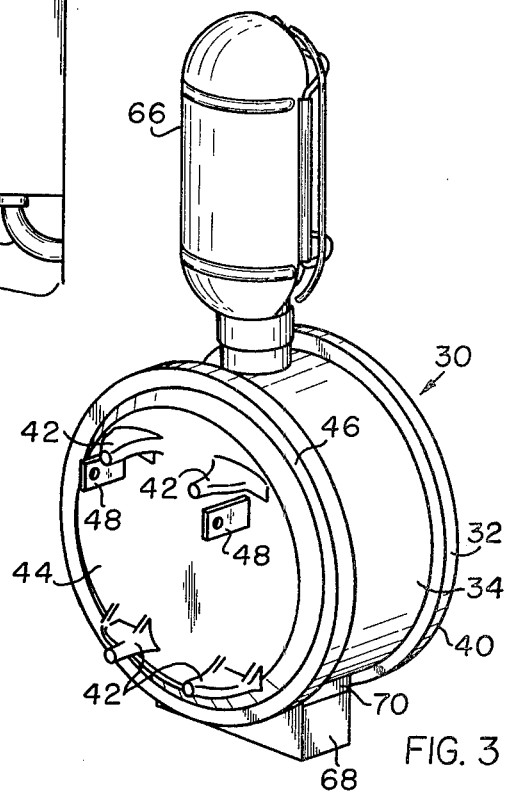
FIG. 3 is a rear perspective view of the embodiment of FIG. 2.
Figure 2:
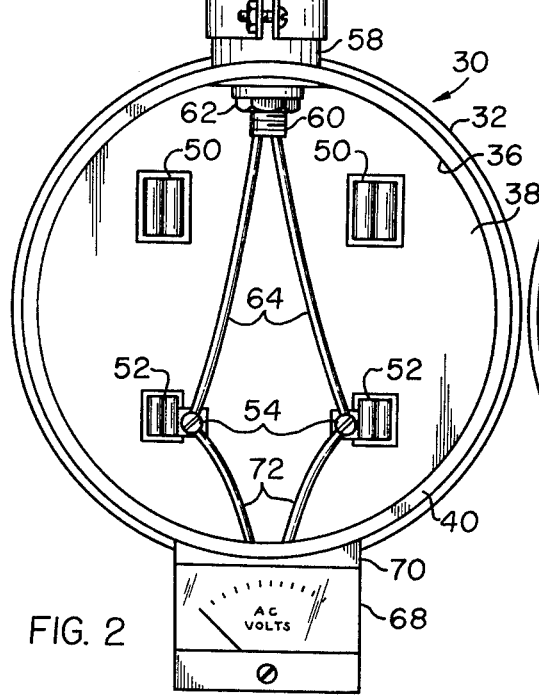
FIG. 2 depicts a front view of one embodiment of a meter testing device constructed according to the teaching of the present invention.

Referring now to FIGS. 2 and 3, there is shown an electric watt-hour meter testing device generally identified by the reference numeral 30. A body 32 of a substantially circular cross-sectional shape is seen to include an upstanding wall portion 34 extending outwardly from and circumferentially about the outer periphery 36 of a forward face 38 of the body 32. The wall portion 34 terminates in a lip or flange 40, which may be selectively configured for a purpose that will become clear as this description proceeds. Thus, the generally planar forward face 38 is rearwardly offset or recessed relative to the projecting lip 40 by the wall portion 34, which may be further described as a tubular projection of a selected height about the periphery 36 of the forward face surface 38. The details thus described simulate those of the meter pan socket 12.

The structural arrangement of the body 32 may be seen in FIG. 3 to further include a plurality of non-conductive spacing and positioning fins 42 projecting outwardly from a substantially planar rear surface or face 44. The fins 42 contribute to the proper placement and proper location of the testing device 30 when the same is operatively positioned in a manner to be described, and may be fabricated integral with the rear surface 44 much like the fins 27 of the meter 22. The rear surface 44 may be constructively configured so as to further include thereon an annular platform or shoulder 46 about the periphery thereof, which shoulder 46 is shown to extend beyond the outer circumference of the tubular wall portion 34. As will become clear, the shoulder 46, like the fins 42, is provided to contribute to the proper operational positioning of the testing device 30 relative to the watt-hour meter 22 and the supporting meter pan 12.

The body 32 is formed of a material that acts as an insulator to the flow of electricity, such as a rigid plastic or similar dielectric material that is easily formed or molded to produce a selectively configured shape. The body 32 may be fabricated as a single integrated unit or constructed as several individual portions which may then be interconnected in any conventional manner to form the unitary body 32. By way of example only, the forward face surface 38 carrying thereon the wall portion 34 may be molded separate and apart from the rear face 44 and the two portions subsequently joined by the use of a series of mating screws and nuts (not shown). Since the testing device 30 may be subjected in use to a wide variety of environmental conditions, a silicone sealer or the like may be employed to form a substantially fluid-tight seal between the portions combined to complete the unitary body 32.

A pair of laterally spaced electrical conducting members 48 is provided on the rear face 44 of the testing device 30. As shown in FIG. 3, the members 48 project outwardly from and substantially perpendicular to the rear surface 44 and may be configured as blade-like, planar members of relatively rectangular shape. The exact configuration of the members 48, however, will depend upon that of the first pair of sockets on the meter pan 12, since the members 48 are positioned on the rear face 44 for mutual engagement with the first socket pair of the meter pan described previously when the testing device 30 is operatively positioned relative to the meter pan 12 in a manner to be described.

The recessed forward face 38 is shown in FIG. 2 to carry a first laterally spaced pair of electrical conducting terminals 50. The first terminal pair 50 is electrically connected to the blade pair 48 and may be formed integral therewith or separately fabricated and thereafter interconnected with wire or the like. A second laterally spaced pair 52 of electrical conducting terminals is also carried on the forward face 38.

As depicted in FIG. 2, the first and second terminal pairs 50, 52 may be formed of an electrically conductive, metallic material that is configured as jaw-like members for receiving the input and output arm pairs 24, 25 respectively of the watt-hour meter 22. Thus, the blade-like arms 24, 25 on the meter 22 are inserted into the correspondingly positioned jaws 50, 52 respectively on the testing device 30 and removably grasped thereby. A screw terminal 54 may be provided on each of the second pair of terminals 52 to facilitate the simple connection of wires thereto.

A lamp 56 is seen positioned at the upper end of the body 32 in FIGS. 1, 2 and 3. A lamp socket 58 is provided with a threaded extension 60 which is journalled through an aperture (not shown) defined in the tubular wall portion 34 of the body 32. A threaded nut 62 engaging the extension 60 may be employed to fixedly secure the socket 58 to the body 32. The socket 58 typically carries internal threads which mate with conforming threads provided on the lamp 56, enabling the removal of the lamp 56 from the socket 58 as necessary or desired. Lengths of wire 64 connect the lamp socket contacts with the screw terminals 54 on the second terminal pair 52. As shown in FIG. 1, a cage 66 may be provided to encircle the lamp 56 and protect the same against possible breakage resulting from accidental contact with other objects.

An Alternating Current voltmeter 68 is mounted in position at the lower end of the body 32. To facilitate the placement of the voltmeter 68 on the body 32, the voltmeter may be mounted on a bracket 70 affixed to the wall portion 34. The voltmeter wires 72 are connected to the screw terminals 54 on the second terminal pair 52. The configuration of the bracket 70 is a matter of design choice and an L-shaped member or a completed enclosure or any other suitable arrangement that may be simply and securely fixed to the wall portion 34 is satisfactory. Likewise, it should be understood that the exact location of the voltmeter 68, or of the lamp 56, at the illustrated position on the body 32 is merely incidental and should not be interpreted as limiting the nature or extent of the present invention.

When it is desired to test the accuracy of the meter 22, the same is disconnected electrically and physically from the pan 12 by pulling it away from the pan after disconnecting all mechanical means that may fasten it to the pan. When the meter 22 is pulled away and out of the pan socket, its conducting arms 24 and 25 become electrically disconnected from the electrical first and second pairs of sockets of the pan. In this way, the meter 22 may be temporarily disassociated from the pan 12 to enable the interposed connection of the test device 30 with the pan 12 between the pan and the meter 22 to be tested, all in the relative expanded relationship as shown in FIG. 1.

In use, the electric watt-hour meter testing device 30 is physically and electronically connected to the electric meter 22 and a meter pan 12 at the normal operating site of the meter 22. As shown in FIG. 1, the testing device 30 is operationally interposed between the suspect watt-hour meter 22 and the supporting meter pan 12 which is suitably mounted at the premises 14. This interposition is accomplished by removing the electric meter 22 from the pan 12 and physically positioning the testing device 30 therebetween. The re-arrangement is possible because the configuration of the tester's forward face 38, and the positioning of the terminals 50, 52 thereon (FIG. 2), substantially matches the configuration of the cavity defined within the flange 16 and the positioning thereon of the input and output socket pairs; the rear face 44 (FIG. 3) of the tester 30 is arranged to simulate the construction of the rearward surface of the meter base portion 28. Thus, the watt-hour meter 22 plugs into the testing device 30 which similarly plugs into the meter pan 12.

The arrows 74, 76 and 78 in FIG. 1 indicate the positions at which mating electrical conducting contacts complete electrical connections between the watt-hour meter 22, the testing device 30 and the meter pan 12. In particular, and as suggested by the arrow 74, the pair of conducting blades 48 are positioned to engage the meter pan first socket pair and thereby feed electrical power from the utility supply cable 10 into the testing device 30. Since the blades 48 are in electrical communication with the testing device first terminal pair 50, engagement of said first terminal pair 50 with the electric meter input arms 24, as indicated by the arrow 76, conducts the electric power drawn from the supply cable 10 directly into the electric meter 22. The arrow 78 illustrates the engagement of the electric meter output arms 25 with the second terminal pair 52 on the testing device 30, whereby after its measured passage through the meter 22, the electric power is returned to the testing device 30. The arrows 80 depict the direction of flow of electricity through the watt-hour meter 22.

Electric power reaching the testing device 30 at the second terminal pair 52 is conducted by the wire pairs 64, 72 to the lamp 56 and the A.C. voltmeter 68, respectively. The lamp 56 serves a dual function. First and foremost, it acts as a constant, fixed electrical load. As such, the amount of power that it draws from the supply line 10—and, therefore, through the watt-hour meter 22—is easily determinable. Generally, for reasons that will become clear as this description proceeds, a preferred value for the lamp 56 is 100 watts at the rated voltage of the supply line 10, although it should be understood that such value is not critical to the proper operation and use of the testing device 30. In fact, the rated wattage printed on such lamps is typically only an approximation thereof and the actual value should, therefore, be carefully measured in any well known manner prior to the first use of a new lamp 56 in the tester 30.

The additional function served by the lamp 56 is that of a "ready" light. The lighting of the lamp 56 indicates to the individual using the testing device 30 that proper electrical connections have been completed between the meter pan 12, the tester 30 and the watt-hour meter 22; the lamp 56 will not light if some problem exists in the electrical interconnections therebetween. Lighting of the lamp 56 informs the user that the tester 30 is properly positioned between the meter 22 and the meter pan 12 and that he may begin the testing of the suspect watt-hour meter 22.

It should in particular be noted that there is no arrow in FIG. 1 to indicate an electric current flow from the testing device 30 to the meter pan 12 for distribution via the load line 20. This reflects the manner in which the tester 30 isolates the distribution line 20 from the electricity fed by the supply cable 10. Such isolation is important to the use of the testing device 30 since the premises 14 typically includes a large number of distinct electrical loads of varying size and duration. Any measurements performed with the tester 30 while such premises time-varying loads are connected therewith would inhibit a knowing determination by the user of the precise size and nature of the electrical load then drawing power through the watt-hour meter 22 under test. Isolation of the load line 20 is, therefore, a practical necessity.

The amount of electrical power consumed by the lamp load 56 at its rated voltage is known, the rated voltage being equal to the normal potential of the electricity available at the supply cable 10. Furthermore, the power being consumed by the lamp load 56 is first passing through the watt-hour meter 22 and being measured thereby. A comparison of the two—of the known power consumption of the lamp 56 and of the quantity measured by the meter over a selected period of time—should, therefore, be indicative of the operational accuracy of the watt-hour meter 22 under test. Often, however, the voltage potential available at the supply cable 10 is less than or greater than the rated value, which is typically 240 volts A.C. To compensate for a possible variation therein, the A.C. voltmeter 68 is electrically connected through the wires 72 across the second terminal pair 52—and thereby across the lamp load 56—so indicate the actual voltage of the electricity being supplied during the test.

Once the testing device 30 has been interposed between the meter pan 12 and the watt-hour meter 22, the lamp load 56 will light to indicate that the apparatus is properly in position. The A.C. voltmeter 68 is then read to determine the voltage potential being supplied by the utility to the tester 30. Next, using a stop watch or comparable timing means, the user times the period of a single complete revolution of the rotating metallic disk which is visible through the glass dome 29 of the watt-hour meter 22, the speed of which disk is proportional to the magnitude of electric power passing through the meter 22. A lamp load 56 of approximately 100 watts has been found to cause the rotating disk of a typical watt-hour meter to turn at a rate which facilitates accurate measurement of the period of rotation thereof.

If a lamp load 56 of a significantly lesser value is employed, the period of rotation becomes extremely long making timing thereof quite tedious, whereas a much higher value for the lamp load 56 tends to result in a shortened period of rotation that may be difficult to accurately time. Of course, the period of a single rotation could also be determined by timing several consecutive rotations of the meter disk and then dividing the result by the number of revolutions timed. Where the meter disk is turning too quickly to permit the period of a single cycle to be accurately measured, timing several rotations thereof has obvious advantages.

The size of the lamp load 56 as measured by the electric watt-hour meter under test may then be determined by employing the following formula:

$$W = \frac{3600 \times Kh \times V_L}{T \times V_m}$$

where:

W = Load as seen by the watt-hour meter (in watts)
Kh = Kh factor of the watt-hour meter
T = Period of one revolution of the meter disk (in seconds)
$V_L$ = Rated potential of the supply line 10 (in volts)
$V_M$ = Actual supply line voltage as indicated by the A.C. voltmeter 68 (in volts)

W, the load seen by the electric watt-hour meter, may then be compared with the actual, known value in watts of the lamp load 56 to ascertain the operational accuracy of the suspect watt-hour meter 22. Typically, a meter variation in the measurement of the load of approximately plus or minus 2% is considered acceptable by State Public Service Commissions and equivalent utility regulatory agencies.

Figure 4:
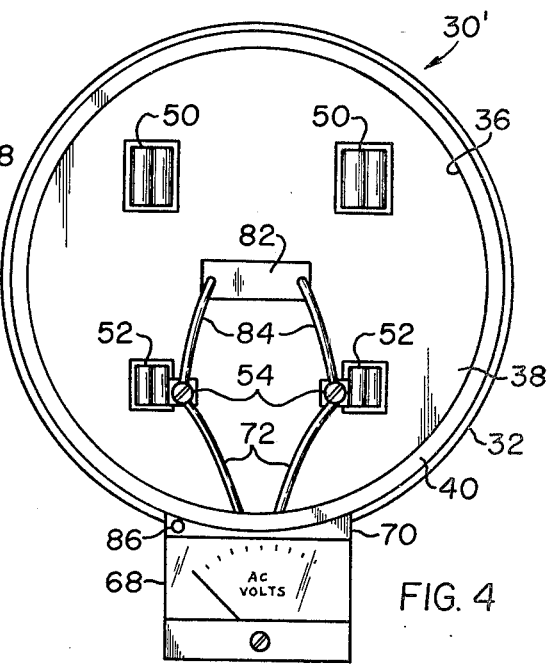
FIG. 4 shows a front view of another embodiment of a meter testing device according to the present invention.

A slight modification of the embodiment illustrated in FIGS. 1-3 is shown in FIG. 4. The sole difference in the FIG. 4 testing device 30' is the absence of a lamp load and the substitution therefor of a fixed resistor 82 which is electrically connected across the second terminal pair 52 by means of the wires 84. The value of the fixed resistor 82 in ohms is easily selected by specifying the desired electrical load to be employed in the testing of the watt-hour meter 22 and using a formula derived from Ohm's Law:

$$R = \frac{V_L^2}{L}$$

where:

R = Resistance of the fixed resistor 82 (in ohms)
$V_L$ = Rated potential of the supply line 10 (in volts)
L = Preselected value of the electrical load (in watts)
Again, a value of L equal to 100 watts has been shown to be a particularly advantageous value for use in testing typical electric watt-hour meters; it should not, however, be construed as a limiting value therefor.

Since the modified testing device 30' of FIG. 4 does not provide a lamp 56 (FIG. 2) to serve as a "ready" light, a small panel light or lamp 86 is included on the bracket casing 70 for that purpose. The panel light 86 may be wired across the contacts of the A.C. voltmeter 68 and draws a negligible amount of electric current that will not significantly affect the results obtained in using the testing device 30'. Illumination of the panel light 86 is an indication to the user that proper electrical connections have been completed between the meter pan 12, the testing device 30' and the watt-hour meter 22, and the testing device 30' is thereafter used in a manner identical to that of the first-described embodiment of FIGS. 1–3.

Figure 5:
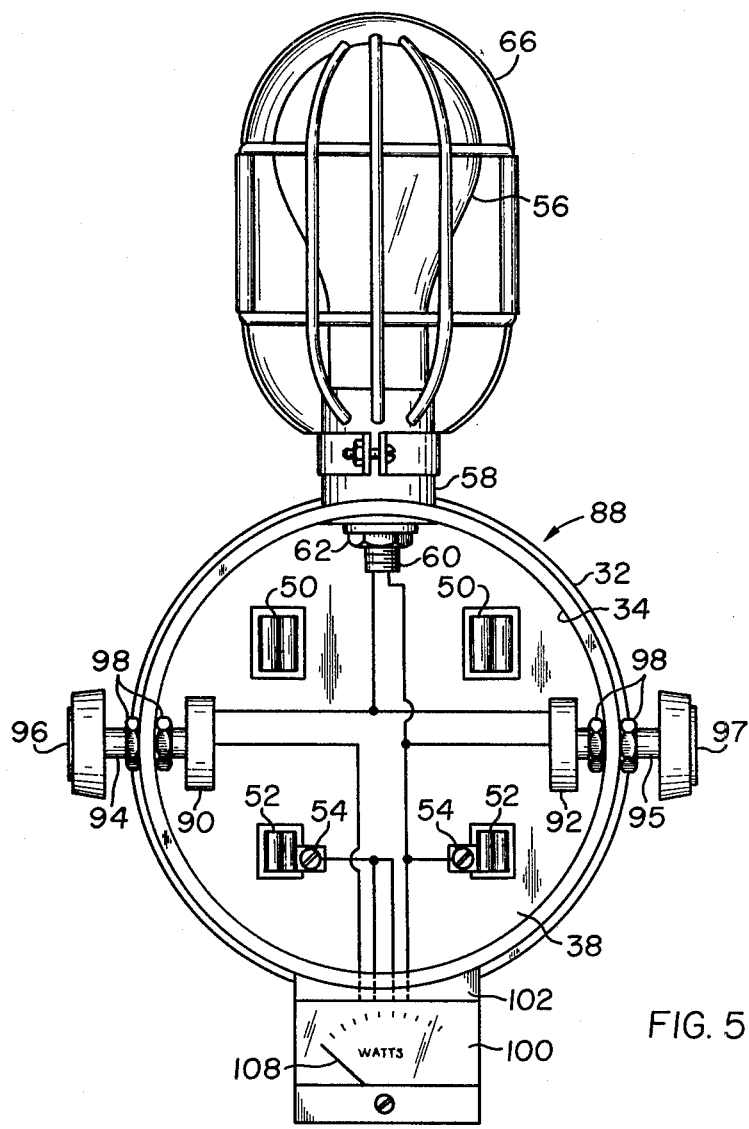
FIG. 5 shows a front view of still another embodiment of a meter testing device in accordance with the present invention.

FIG. 5 illustrates still another embodiment of the present invention. The watt-hour meter testing device of FIG. 5 is generally designated by the reference numeral 88. The structural details of the tester body 32 and of the placement of the pairs of conducting blades and terminals 48, 50, 52 and of the lamp load 56 thereon are identical with the description set forth above with regard to the embodiment of FIGS. 2 and 3 and, therefore, any repetition of such details would be redundant and superfluous and is omitted. Likewise, although in this embodiment of the testing device 88 a fixed resistor 82 and a pilot lamp or "ready" light 86 may be substituted in lieu of the lamp load 56 as described in relation to the embodiment of FIG. 4, a discussion of each substitution is omitted and the feasibility thereof should be inherently recognized. For convenience and understanding, like reference numerals are employed in FIG. 5 wherever possible to indicate like elements among the several embodiments.

The base 32 of the testing device 88 carries thereon, and more particularly on the upstanding wall portion 34 thereof, first and second variable resistors or rheostats 90, 92. The resistance of the rheostats 90, 92 is variably adjustable by means of respective rotatable shafts 94, 95 projecting therefrom and carrying knobs 96, 97 on the ends thereof to facilitate the manual turning of the shafts 94, 95. Mounting of each of the rheostats 90, 92 may be accomplished by passing its respective shaft through an aperture defined in the wall 34 and securing a threaded bushing provided on each rheostat to the wall 34 by means of nuts 98.

Figure 6:
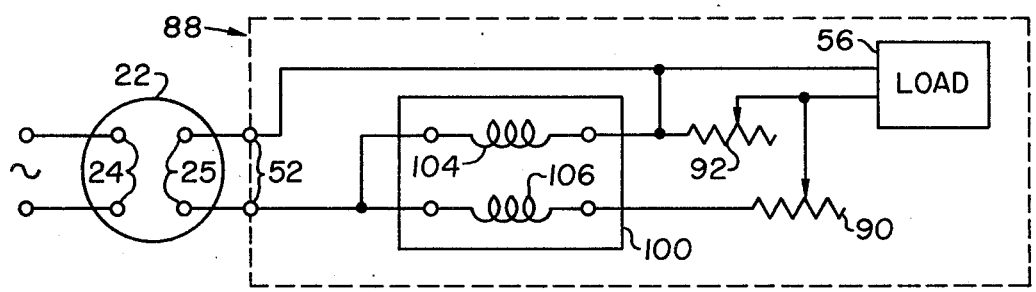
FIG. 6 is an electrical schematic diagram of the meter testing device of FIG. 5 and its electrical interconnection to a watt-hour meter under test.

An A.C. wattmeter 100 is secured to the tester base 32, as for example by mounting the wattmeter 100 on a bracket 102 fixed to the wall portion 34. Since electrical energy is a product of both voltage and current, the wattmeter 100 contains two coils, one of which must be connected across the line to which the load is connected to measure voltage, while the other one is connected in series with the load to measure current. Thus, as shown in FIG. 6 which is a schematic diagram of the testing device 88, the wattmeter voltage coil 104 is connected across the second terminal pair 52, and its current coil 106 is connected in series with the first rheostat 90 and the lamp load 56 across the terminal pair 52. The second rheostat 92 is seen to be connected across the load 56.

Operation and use of the testing device 88 is initiated by interposing the device between the meter pan 12 and the watt-hour meter 22 in the manner shown in FIG. 1 and more particularly described hereinbefore with regard to the embodiment of FIGS. 2 and 3. The lamp 56 will light to indicate that proper electrical connections have been completed therebetween. The embodiment of the testing device 88 shown in FIG. 5 permits adjustment by the user to selectively determine the size of the load to be employed in testing the operational accuracy of the watt-hour meter 22. As previously noted, the rated load value of the lamp 56 printed thereon is oftentimes no more than an approximation of the magnitude of electrical power consumed thereby.

When a new lamp 56 is to be used in a device 88 for the first time, it would, therefore, be necessary to independently determine its actual electrical power consumption. In addition, any variation in the voltage potential of the electricity fed from the supply cable 10 will further affect the amount of power actually consumed by the lamp 56. It would, therefore, be desirable to provide means for easily ascertaining the precise amount of electrical energy being drawn through the watt-hour meter 22 for consumption in the testing device 88 at the time of the actual testing of the meter 22.

The testing device 88 provides the rheostats 90, 92 and the wattmeter 100 to enable the user to selectively adjust the amount of electrical power being consumed to a predetermined value. Thus, by rotation of the knobs 96, 97 to vary the resistance of th rheostats 90, 92, the user may decrease or increase the size of the effective electrical load, and therefore the amount of electrical energy drawn through the watt-hour meter 22 and consumed in the testing device 88. The wattmeter 100 provides a visual indication of the amount of electric power being consumed to facilitate the adjustments to yield a preselected value.

More particularly, the first rheostat 90 is connected in series with the lamp load 56. The initial rotational position of its shaft 94 should be such as to create a zero ohms resistance path, or short circuit, across the rheostat 90; i.e. its minimum resistance position. If the position of the pointer 108 on the wattmeter 100 initially shows that a magnitude of electrical power greater than the desired value is being drawn through the watt-hour meter 22, the shaft 94 of the first rheostat 90 may be rotated from its initial position. This rotation will increase its resistance, thereby increasing the series load resistance and decreasing the amount of electrical power being consumed by the combination of the rheostat 90 and the lamp 56. When the wattmeter pointer 108 indicates the desired amount of power consumption, rotation of the shaft 94 should be discontinued.

If, on the other hand, an initial examination of the wattmeter 100 indicates that the amount of electrical power being drawn through the watt-hour meter 22 is less than the preselected value, the first rheostat 90 should be retained in its initial zero resistance position and the second rheostat 92 should instead be utilized. Inasmuch as the rheostat 92 is connected directly across the lamp load 56, it constitutes a separate electrical load—in addition to that of the lamp 56—drawing power through the watt-hour meter 22. The resistance of the rheostat 92 as determined by the rotational position of its shaft 95 will determine the amount of electrical power consumed by this additional load.

The initial rotational position of the shaft 95 should be such as to place across the contacts of the rheostat 92 its maximum resistance. This will minimize the current flow through the rheostat 92 and consequently the electrical power consumption therein. A set of switch contacts (not shown) may, if desired, be provided on the rheostat 92 or separately therefrom and connected in series with the rheostat 92 to disconnect the same from the circuit when it is not necessary to increase the amount of electrical power being drawn through the meter 22. Rotation of the shaft 95 from the initial maximum resistance position will decrease the resistance of the rheostat 92 and thereby increase the electrical power drawn through the watt-hour meter 22. When the wattmeter 100 indicates that the electrical power consumption has reached the preselected value, rotation of the shaft 92 may be discontinued.

It should be appreciated that a minor modification of the testing device 88 can render the same even easier to use. The substitution of a fixed resistance for the rheostat 92 will insure that the amount of electric power drawn through the watt-hour meter 22 under test is initially greater than the rated value of the lamp 56. Such a modified device 88' may be seen schematically in FIG. 7. Thus, the combination load resulting from inclusion of a fixed resistance 92' in parallel electrical connection with the lamp load 56 effects an increase in electrical power consumption of such combination load relative to the power consumption of the lamp 56 alone.

By predeterminately selecting the value of the fixed resistance 92', power consumption in the combination load can be made to be greater than the said preselected value of electrical power desirably drawn through the suspect watt-hour meter 22. As a consequence, and since the amount of initial power consumption is known to be greater than the preselected value, only a single rheostat 90 is required to vary—i.e. to decrease—the electrical power consumption in the load. It is never necessary to further increase such load consumption, and, therefore, an additional rheostat or like power-varying means need not be provided for such purpose. The modified testing device 88' is, therefore, easier to use than the device 88 of FIGS. 5 and 6 as only a single rheostat 90 need be manipulated to desirably draw the preselected value of electrical power through the watt-hour meter 22 under test.

Figure 7:
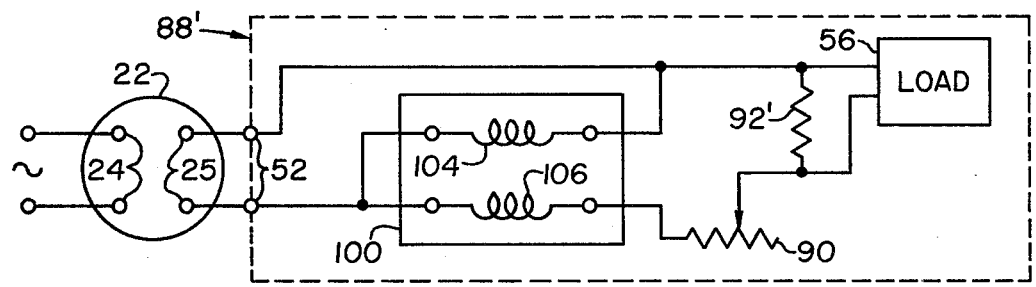
FIG. 7 is an electrical schematic diagram similar to FIG. 6 of an additional embodiment of a meter testing device in accordance with the present invention.

Although a simple potentiometer or rheostat 90 is shown in FIG. 7 for decreasing the amount of power drawn through the watt-hour meter 22, it should be clear that well-known equivalent devices could be substituted therefor. Thus, by way of example, an SCR control circuit (not shown), such as those commonly employed as "lamp dimmers," may be utilized in place of the rehostat 90. Use of an SCR control circuit to decrease the amount of electric power drawn through the watt-hour meter 22 enables the testing device 88' to handle a substantial electric current without necessitating the use of a prohibitively large rheostat 90.

It can, therefore, be appreciated in the embodiment of FIGS. 5 and 6 that by the selective rotation of the shafts 94, 95 of the rheostats 90, 92, the amount of electrical power drawn through the watt-hour meter 22 and consumed in the testing device 88 may, in conjunction with the wattmeter 100, be easily adjusted to a desired, preselected value. Likewise, in the embodiment of FIG. 7, the single rheostat or control 90 may be adjustably employed to attain such a desired, preselected value of electrical power consumption. Preferably, as discussed hereinbefore, this adjusted value of power consumption is 100 watts. This value provides a conveniently measurable meter disk period of rotation and significantly lessens the complexity of required calculations. With the wattmeter 100 indicating that 100 watts is being drawn through the watt-hour meter, the rotating disk of the meter 22 is thereafter timed for at least one complete revolution thereof using a stop watch or the like as previously described. The operational accuracy of the meter 22 under test may then be determined by comparing that result with the period of rotation of the meter disk of a properly calibrated watt-hour meter measuring an equivalent 100 watt load, which may be calculated from the formula:

$$T_A = 36Kh$$

where:

$T_A$ = Period of rotation of the meter disk of an accurate watt-hour meter measuring a 100 watt load (in seconds)

KH = Kh factor of the watt-hour meter

If the watt-hour meter 22 is thereby shown to be operating in an unacceptably inaccurate manner, it may be removed to a specially-equipped laboratory where recalibration may be accomplished with highly sophisticated apparatus. If, however, use of the testing device has demonstrated that the meter 22 is operating accurately within acceptable tolerances, it is clearly unnecessary to remove the same from its normal operational premises, and a significant savings in otherwise wasted time in the utilization of employees and in the use of specialized facilities has been realized through use of the present invention.

There has thus been pointed out and described an electric watt-hour meter testing device that enables an expeditious determinations at the normal operating site of the operational accuracy of a suspect meter by passing a selected magnitude of electrical power therethrough into a known electrical load and using the watt-hour meter to measure the size of that load. The meter testing device is simple and inexpensive to fabricate so as to insure its durability under varied conditions of environment and operation. Its use of only a small number of readily available components significantly enhances its operational reliability in the field. Furthermore, the meter testing device is easy to use and requires virtually no specialized technical training of the individual.

While there have been shown and described and pointed out the fundamental novel features of the invention as applied to preferred embodiments thereof, it will be understood that various omissions and substitutions and changes in the form and details of the devices illustrated and in their operation may be made by those skilled in the art without departing from the spirit of the invention. It is the intention, therefore, to be limited only as indicated by the scope of the claims appended hereto.

What is claimed is:

1. A device to check the accuracy of a watt-hour meter at its operational site in which the meter has electric supply line contacts and electric load contacts and is adapted to be detachably supported on a supporting socket in electrical engagement with respective electric supply line contacts and electric load contacts on the supporting socket such that the electric supply line contacts of the supporting socket and meter are electrically connected with an electric supply line and the electric load contacts of the meter and supporting socket are connected with the load of the operational site;

said device comprising a dielectric base that is adapted to be detachably supported on the supporting socket to be interposed between the meter and the supporting socket, electric supply line contacts on said base for electrical conducting engagement with the electric supply line contacts on the supporting socket and for electric conducting engagement with the electric supply line contacts of the meter, electric isolating contact means on said base for receiving the electric load contacts of the meter such that when the meter is detached from the supporting socket to enable the base to be mounted on the supporting socket so that the meter is then able to be mounted on the base, said electric supply contacts on said base complete an electric circuit from the supply line through the electric supply line contacts of the supporting socket, through said base, and then through the meter with said electric isolating contact means fully electrically isolating the electric load contacts of the meter from the electric load of the operational site and also from preventing electrical contact between the load contacts of the meter and the electric load contacts of the supporting socket such that said base insulates the meter from the supporting socket and from the load of the operational site, electrical load means having a predetermined wattage rating at a rated line voltage connected to said load contacts of said meter, and electrical measuring means connected to said load contacts of said meter for determining the power consumed by said electrical load means, the arrangement being such that when said device is mounted on said supporting socket and said meter is mounted on said base, only said electrical load means and said electrical measuring means are connected to said load contacts of said meter.

2. A device to check the accuracy of a watt-hour meter according to claim 1, wherein said electrical load means includes means for selectively adjusting the magnitude of electric power consumed by said electrical load means to a predetermined value.

3. A device to check the accuracy of a watt-hour meter according to claim 2, wherein said means for adjusting said electrical load means includes resistance means in parallel electrical connection with said electrical load means, and variable resistance means in series electrical connection with said electrical load means for selectively adjusting the power consumed by said electrical load means.

4. A device to check the accuracy of a watt-hour meter according to claim 1 wherein said electrical measuring means is a voltmeter for measuring actual line voltage applied to said electrical load means so that the actual power consumed thereby can be determined.

5. A device to check the accuracy of a watt-hour meter according to claim 1 wherein said electrical measuring means is a wattmeter, and said device includes variable circuit means, and means for adjusting said circuit means so that the power consumed by said electrical load means and said circuit means as measured by said wattmeter corresponds to the wattage rating of said electrical load means.

* * * * *